(12) United States Patent
Coburn

(10) Patent No.: US 11,785,747 B2
(45) Date of Patent: Oct. 10, 2023

(54) METHODS AND DEVICES FOR TESTING IMMERSION COOLING CONTROLLERS

(71) Applicant: TMGCore, INC., Plano, TX (US)

(72) Inventor: Randall Coburn, Plano, TX (US)

(73) Assignee: TMGCore. INC., Plano, TX (US)

( * ) Notice: Subject to any disclaimer, the term of this patent is extended or adjusted under 35 U.S.C. 154(b) by 0 days.

(21) Appl. No.: 17/979,539

(22) Filed: Nov. 2, 2022

(65) Prior Publication Data

US 2023/0240050 A1 Jul. 27, 2023

Related U.S. Application Data

(63) Continuation-in-part of application No. 17/573,319, filed on Jan. 11, 2022, now Pat. No. 11,570,935, which is a continuation-in-part of application No. 17/370,237, filed on Jul. 8, 2021, now Pat. No. 11,224,144, which is a continuation of application No. 17/136,113, filed on Dec. 29, 2020, now Pat. No. 11,064,634, application No. 17/979,539 is a continuation-in-part of application No. 17/136,474,
(Continued)

(51) Int. Cl.
G01R 31/28 (2006.01)
H05K 7/20 (2006.01)
G06F 1/20 (2006.01)

(52) U.S. Cl.
CPC ........... H05K 7/20809 (2013.01); G06F 1/20 (2013.01); *G06F 2200/201* (2013.01)

(58) Field of Classification Search
CPC .............. H05K 7/20836; H05K 7/203; H05K 7/20236; H05K 7/20381; H05K 7/20281; G01R 31/2889; G01R 31/2834; G06F 1/206; G06F 1/20; G06F 3/0416; G06F 1/3231; G06F 11/3058; G06F 13/102; G05B 13/024; G05B 13/021; F28D 15/06
USPC .............................. 361/699; 702/50; 703/15
See application file for complete search history.

(56) References Cited

U.S. PATENT DOCUMENTS 7,213,391 B2  5/2007  Jones
7,885,070 B2  2/2011  Campbell et al.
(Continued)

FOREIGN PATENT DOCUMENTS

WO   2019138176 A1   7/2019
WO   2020225649 A1   11/2020
(Continued)

*Primary Examiner* — Mandeep S Buttar
(74) *Attorney, Agent, or Firm* — Hunton Andrews Kurth LLP

(57) ABSTRACT

The present disclosure refers to methods and electronics used to test immersion cooling controllers. A representative method comprises operably connecting a simulator device to an immersion cooling controller. The simulator device is used to communicate one or more changes to the immersion cooling controller wherein the one or more changes relate to one or more sensed parameters of an immersion cooling system. The reaction of the controller to the one or more changes is compared to an expected reaction of the controller to determine whether the controller is functioning properly. The controller may be configured to control any parameter of an immersion cooling system including, but not limited to, temperature, water flow, pressure, fluid level, fluid purity, and any combination thereof.

2 Claims, 3 Drawing Sheets

Related U.S. Application Data filed on Dec. 29, 2020, which is a continuation of application No. PCT/US2019/060759, filed on Nov. 11, 2019.

(60) Provisional application No. 63/274,759, filed on Nov. 2, 2021, provisional application No. 62/981,098, filed on Feb. 25, 2020, provisional application No. 62/897,457, filed on Sep. 9, 2019, provisional application No. 62/875,222, filed on Jul. 17, 2019, provisional application No. 62/815,682, filed on Mar. 8, 2019, provisional application No. 62/768,633, filed on Nov. 16, 2018.

(56) References Cited

U.S. PATENT DOCUMENTS

| | | |
|---|---|---|
| 7,957,145 B2 | 6/2011 | Suzuki et al. |
| 7,961,475 B2 | 6/2011 | Campbell et al. |
| 8,009,419 B2 | 8/2011 | Attlesey et al. |
| 8,014,150 B2 | 9/2011 | Campbell et al. |
| 8,089,765 B2 | 1/2012 | Attlesey |
| 8,194,406 B2 | 6/2012 | Campbell et al. |
| 8,351,206 B2 | 1/2013 | Campbell et al. |
| 8,490,418 B2 | 7/2013 | Weber et al. |
| 8,711,565 B2 | 4/2014 | Wagoner et al. |
| 8,867,209 B2 | 10/2014 | Campbell et al. |
| 8,941,994 B2 | 1/2015 | Campbell et al. |
| 8,947,873 B2 | 2/2015 | Campbell et al. |
| 8,953,317 B2 | 2/2015 | Campbell et al. |
| 8,953,320 B2 | 2/2015 | Campbell et al. |
| 8,964,391 B2 | 2/2015 | Campbell et al. |
| 8,966,922 B2 | 3/2015 | Campbell et al. |
| 8,976,526 B2 | 3/2015 | Kulkarni et al. |
| 9,049,800 B2 | 6/2015 | Shelnutt et al. |
| 9,095,942 B2 | 8/2015 | Campbell et al. |
| 9,101,078 B2 | 8/2015 | Campbell et al. |
| 9,144,179 B2 | 9/2015 | Shelnutt et al. |
| 9,153,374 B2 | 10/2015 | Kulkarni et al. |
| 9,178,400 B2 | 11/2015 | Pal et al. |
| 9,195,282 B2 | 11/2015 | Shelnutt et al. |
| 9,223,360 B2 | 12/2015 | Attlesey et al. |
| 9,261,308 B2 | 2/2016 | Campbell et al. |
| 9,282,678 B2 | 3/2016 | Campbell et al. |
| 9,313,920 B2 | 4/2016 | Campbell et al. |
| 9,328,964 B2 | 5/2016 | Shelnutt et al. |
| 9,332,674 B2 | 5/2016 | Campbell et al. |
| 9,351,429 B2 | 5/2016 | Shelnutt et al. |
| 9,357,675 B2 | 5/2016 | Campbell et al. |
| 9,414,520 B2 | 8/2016 | Campbell et al. |
| 9,433,132 B2 | 8/2016 | Krishnan et al. |
| 9,516,792 B2 | 12/2016 | Krishnan |
| 9,543,787 B2 | 1/2017 | Duchesneau |
| 9,596,787 B1 | 3/2017 | Iyengar et al. |
| 9,622,379 B1 | 4/2017 | Campbell et al. |
| 9,655,279 B2 | 5/2017 | Pelletier et al. |
| 9,713,290 B2 | 7/2017 | James et al. |
| 9,773,526 B2 | 9/2017 | Shelnutt et al. |
| 9,904,811 B2 | 2/2018 | Campbell et al. |
| 9,912,021 B2 | 3/2018 | Andres |
| 9,913,402 B2 | 3/2018 | Shafer et al. |
| 9,918,408 B2 | 3/2018 | Regimbal et al. |
| 9,921,622 B2 | 3/2018 | Shelnutt et al. |
| 9,974,212 B2 | 5/2018 | Ichinose et al. |
| 9,992,914 B2 | 6/2018 | Best et al. |
| 10,015,905 B2 | 7/2018 | Watanabe et al. |
| 10,018,425 B2 | 7/2018 | Shelnutt et al. |
| 10,020,242 B2 | 7/2018 | Katsumata et al. |
| 10,028,409 B1 | 7/2018 | Metzler et al. |
| 10,070,558 B2 | 9/2018 | Campbell et al. |
| 10,098,260 B2 | 10/2018 | Bouras et al. |
| 10,104,814 B2 | 10/2018 | Wagoner et al. |
| 10,130,008 B2 | 11/2018 | Shepard et al. |
| 10,149,408 B2 | 12/2018 | Fujiwara et al. |
| 10,206,307 B2 | 2/2019 | Lau |
| 10,206,308 B2 | 2/2019 | Meijer et al. |
| 10,257,960 B1 | 4/2019 | Banerjee et al. |
| 10,321,603 B1 | 6/2019 | Banerjee et al. |
| 10,485,137 B2 | 11/2019 | Helsel et al. |
| 10,512,192 B2 | 12/2019 | Miyoshi |
| 10,568,236 B2 | 2/2020 | Tian et al. |
| 10,609,839 B1 | 3/2020 | Archer et al. |
| 10,765,033 B1 | 9/2020 | Keehn et al. |
| 10,966,349 B1 | 3/2021 | Lau |
| 11,076,508 B2 | 7/2021 | Gao |
| 11,116,113 B2 | 9/2021 | Chiu et al. |
| 2014/0139251 A1* | 5/2014 | De La Puente ...... G01R 1/0408 324/756.01 |
| 2017/0212164 A1* | 7/2017 | Caradonna ....... G01R 31/31905 |
| 2018/0264281 A1* | 9/2018 | Kim ..................... A61N 5/025 |
| 2019/0267683 A1 | 8/2019 | Shepard et al. |
| 2019/0357378 A1 | 11/2019 | Kolar et al. |
| 2020/0113083 A1 | 4/2020 | Schon et al. |
| 2020/0178414 A1 | 6/2020 | Bulinski et al. |
| 2020/0386488 A1 | 12/2020 | Smith et al. |
| 2021/0018356 A1 | 1/2021 | Bean, Jr. et al. |
| 2021/0059079 A1 | 2/2021 | Keehn et al. |
| 2021/0084790 A1 | 3/2021 | Sachdev et al. |
| 2021/0180874 A1 | 6/2021 | Eadelson |
| 2022/0117114 A1* | 4/2022 | Farias Moguel .. H05K 7/20236 |

FOREIGN PATENT DOCUMENTS

| | | |
|---|---|---|
| WO | 2021111296 A1 | 6/2021 |
| WO | 2019155179 A1 | 8/2022 |

* cited by examiner

METHODS AND DEVICES FOR TESTING IMMERSION COOLING CONTROLLERS

CROSS-REFERENCE TO RELATED APPLICATIONS

This application is related to PCT publication WO2020/102090 filed Nov. 11, 2019 titled "Liquid Immersion Cooling Platform" owned by TMGCore, LLC which application is incorporated herein by reference.

FIELD OF THE DISCLOSURE

The present disclosure relates to testing methods using, for example, electronic equipment to test controllers used in a liquid immersion cooling system for computer components.

BACKGROUND AND SUMMARY

Immersion cooling, e.g., two-phase immersion cooling, is becoming more common as computing power increases and heat from computing components needs to be dissipated. In immersion cooling computer components and other electronics may be submerged in a dielectric or electrically non-conductive liquid in order to draw heat directly from the component into the liquid. Immersion cooling is used to reduce the total energy needed to cool computer components and may also reduce the amount of space and equipment necessary for adequate cooling.

As immersion cooling become more common the systems become more complex and controllers may be programmed to control and adjust various parameters of the system. Unfortunately, one may risk damaging valuable computer components or other components of an immersion cooling system when testing whether a controller is functioning as intended What is needed is a solution so that immersion cooling controllers may be tested without risking harm to computer components or other equipment of the immersion cooling system. It would further be desirable if such a solution was not particularly costly, was applicable to many immersion cooling system controllers, and/or was relatively easy to implement.

Advantageously, the instant application pertains to new methods and devices which allows for testing of immersion cooling controllers outside of an immersion cooling system and is broadly applicable to many immersion cooling system controllers.

The method comprises operably connecting a simulator device to an immersion cooling controller. The simulator device is used to communicate one or more changes to the immersion cooling controller wherein the one or more changes relate to one or more sensed parameters of an immersion cooling system. The reaction of the controller to the one or more changes is compared to an expected reaction of the controller to determine whether the controller is functioning properly. The controller may be configured to control any parameter of an immersion cooling system including, but not limited to, temperature, water flow, pressure, fluid level, fluid purity, and any combination thereof.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Various embodiments of the present disclosure, together with further objects and advantages, may best be understood by reference to the following description taken in conjunction with the accompanying drawings.

DETAILED DESCRIPTION

The following description of embodiments provides a non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

Immersion Cooling Systems

Figure 1:
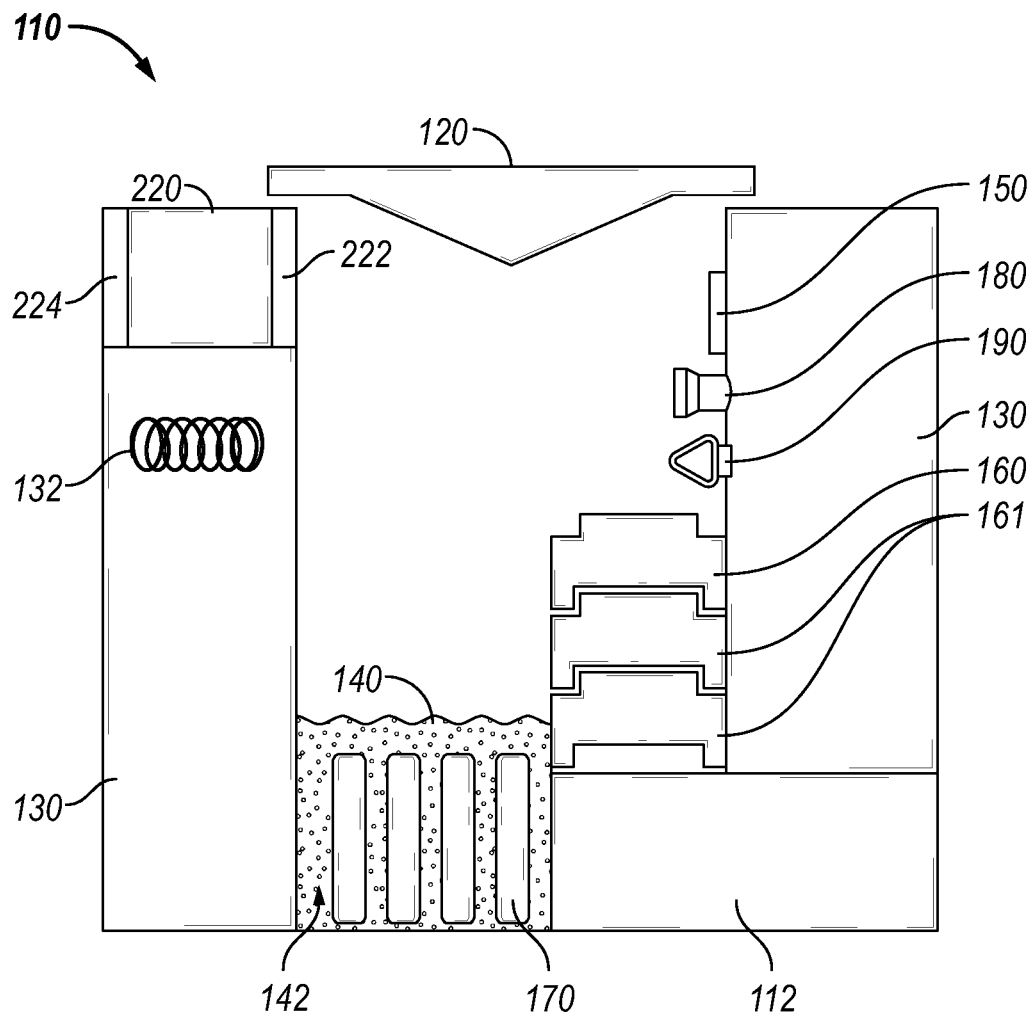
FIG. 1 shows a schematic of an immersion cooling system.

The methods and devices described herein are broadly applicable to testing immersion cooling system controllers regardless of the specific system. For ease of reference the methods and devices will be described with reference to controllers used in a two phase immersion cooling system. FIG. 1 shows a schematic of a representative immersion cooled computing system 110. Embodiments of the disclosed cooled computing system 110 (or computing system, system, vessel, or pressure controlled vessel, all of which can be used interchangeably) may utilize a liquid dielectric fluid 140 to cool computer component 170 by immersing the component into a bath of the fluid. As electricity is passed through the component 170, the component 170 generates heat. As the component 170 heats up, the performance of the component may be reduced or the component may be damaged to the point of failure. It is advantageous to maintain the various computing components at a stable and relatively low temperature. In some embodiments, computer component 170 may be kept at less than about 80° C., or less than about 70° C., or less than about 65° C., or less than about 60° C., or less than about 55° C. In some embodiments, computer component 170 may be maintained at greater than about 60° C., or greater than about 50° C., or greater than about 40° C., or greater than about 35° C., or greater than about 30° C. As the computer component 170 heats up, heat is transferred to the liquid dielectric fluid 140 surrounding the component 170. When the liquid dielectric fluid reaches its boiling point, it will shift from a liquid phase into a gaseous phase and rise out of the liquid bath 142. The components 170 in the bath 142 of dielectric fluid may generally be maintained at about the boiling point of the particular dielectric fluid 140 being used.

When the liquid dielectric fluid is heated to the point of vaporization at the pressure employed for a given application and becomes a gas, bubbles of the dielectric vapor will rise out of the liquid bath 142 and rise to the top of the system 110. The vapor is then cooled to be point of condensing using condenser 130. Depending on the configuration of the system 110, the heating and cooling of dielectric fluid from liquid phase to vapor phase and back, can create a convection current.

Sensors

It is often desirable to monitor one or more parameters of an immersion cooling system such as a two phase immersion cooling system. One or more parameters may be monitored through use of various sensors may be placed to ensure that the system is operating as designed. The number and type of sensors may be modified based on the type of system, user preference, and other factors. In some embodiments for a two phase immersion cooling system a sensor package may include one or more temperature sensors in the vapor space; one or more temperature sensors in the liquid space; one or more humidity sensors in the vapor space; and/or one or more pressure sensors in the vapor space. These sensor readings may be monitored by software operably connected to the controller and/or by human operators to ensure that the system is operating as desired. In some embodiments, the sensor data may be recorded or later analyzing.

Additional sensors may be incorporated within the vessel or the super structure of a two phase immersion cooling system. Such sensors could include, for example, FLIR based heat imaging cameras; VESDA or other forms of aspirating smoke detectors; and/or refrigerant leak detectors designed to detect a leak of the dielectric fluid into the surrounding environment.

In some systems the pressure controlled vessel 110 may include sensors to ensure safe operation. These sensors may include, but are not limited to, one or more of temperature sensors, fluid level sensors, pressure sensors 180, gaseous partial pressure sensors, position sensors, electrical sensors, microphones, and/or cameras to ensure and/or automate operations of the system.

Temperature sensors may include, but not limited to, sensors for measuring the temperature of the gaseous phase within the pressure controlled vessel 110, sensors for measuring the temperature of the liquid phase within the pressure controlled vessel, sensors for measuring the temperature water and/or other process fluids, and/or sensors for measuring the temperature of the other components including the computer components 170. In some systems, thermocouples, thermistors, and/or silicone sensors may be utilized to measure the temperature of computer components. In some embodiments, the system may rely on information provided by the components themselves and retrieved or monitored through the use of a generally accepted communications protocol, such as a device provided API or other programmatic interface, such JSON via HTTPT or SNMP, to determine the equipment temperature.

Immersion Cooling Controllers

The controllers that may be tested using the methods and devise herein may be configured with or without software and may be configured to receive any data generated by any of the sensors described above and make an adjustment, provide an alert, and/or take another appropriate action. Thus, a controller may be configured to adjust or control a heating element, adjust water flow or temperature, adjust a pressure, adjust a fluid level, fluid purity and/or any number of other system parameters. Such adjustments are often based on one or more sensed parameters of an immersion cooling system such as any of those described above.

Simulator Device

The present application employs a simulator device that is operably connect to an immersion cooling controller. In this manner the controller can be tested without being employed in an immersion cooling system. The simulator device is configured to communicate one or more simulated changes in the operation of an immersion cooling system to the immersion cooling controller. That is, the simulator device mimics a signal that the controller would receive if it was employed in an immersion cooling system even though it is being tested without being connected to an immersion cooling system. The one or more changes from the simulator device may simulate one or more sensed parameters of an immersion cooling system. The one or more sensed parameters may be any of those associated with any of the sensors described above that could be within an immersion cooling system, e.g., temperature, water flow, pressure, fluid level, fluid purity, and any combination thereof. In order to determine whether the controller is functioning properly one may compare a reaction of the controller to the one or more changes to an expected reaction of the controller, i.e., the desired programmed response. In this manner one may determine whether the controller is functioning properly.

Figure 2:
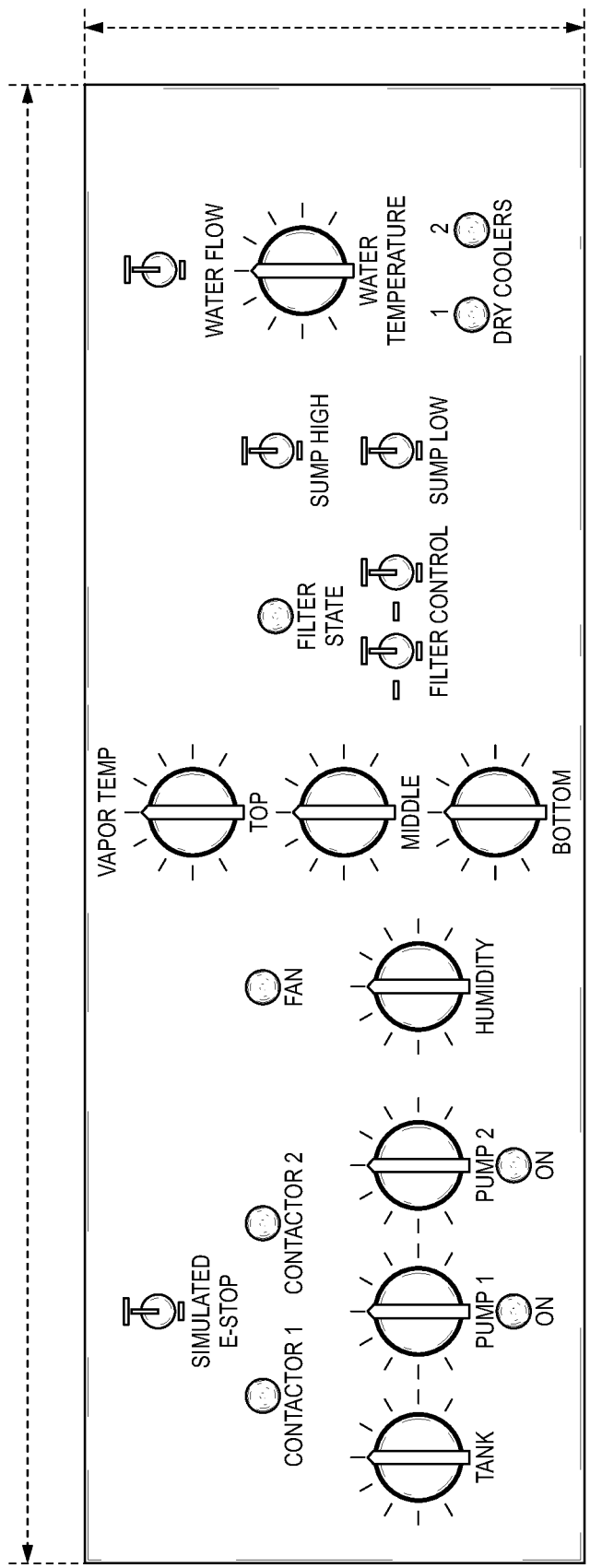
FIG. 2 shows a representative manual control panel for a simulator device.

FIG. 2 shows a representative manual control panel for a simulator device. The manual control panel may be used to adjust various simulated sensed parameters and communicate the simulated changes in the operation of an immersion cooling system to the immersion cooling controller.

Figure 3:
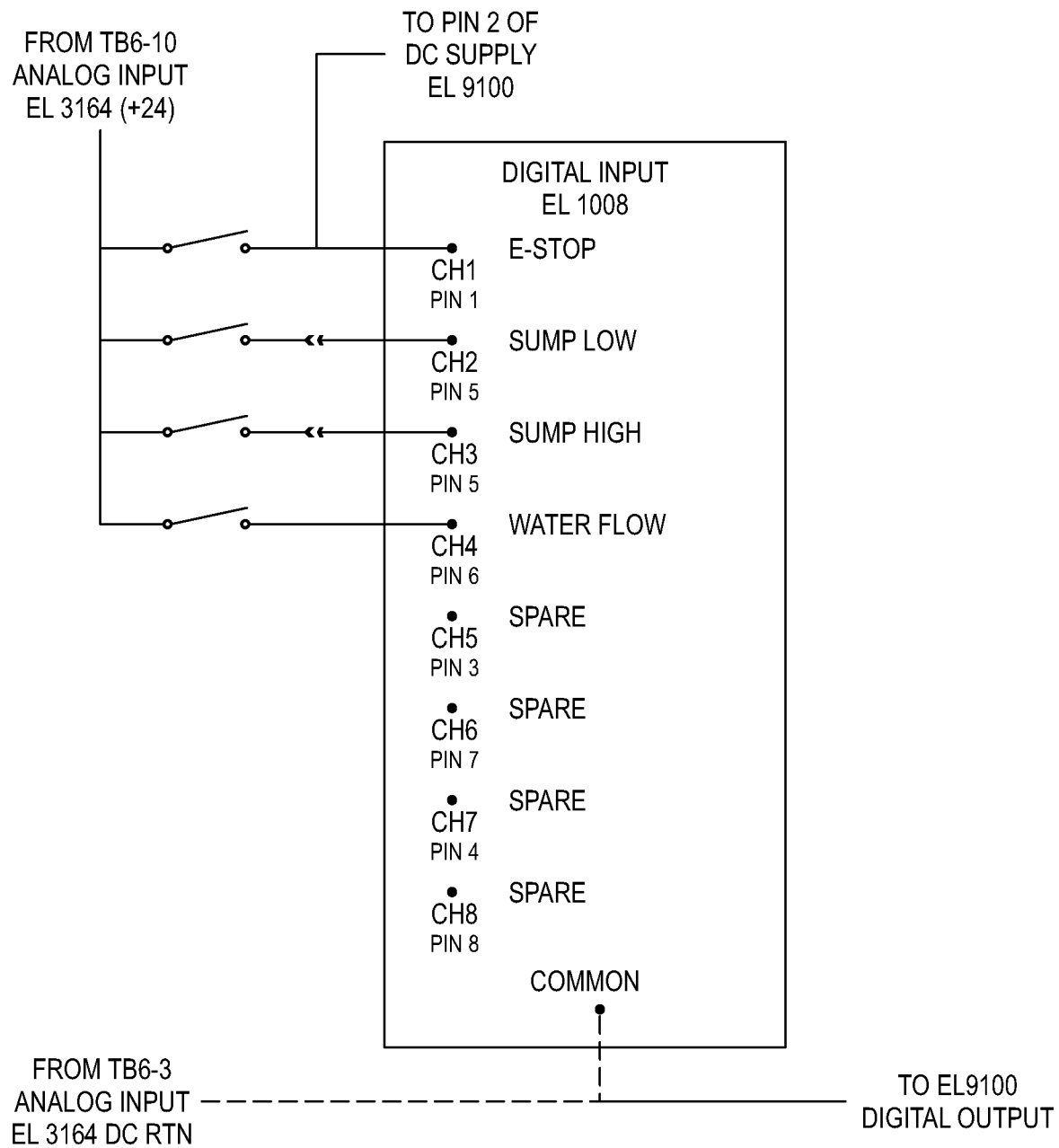
FIG. 3 shows a representative SS relay that may be used in the simulator device.

FIG. 3 shows a representative solid state relay switch that may be used in the simulator device. The relay may facilitate opening and/or closing one or more circuits electromechanically or electronically, Such switches, if employed, may assist in simulating one or more sensed parameters or change in parameters of an immersion cooling system and communicating the sensed or changed parameters to the controller.

In the preceding specification, various embodiments have been described with references to the accompanying drawings. It will, however, be evident that various modifications and changes may be made thereto, and additional embodiments may be implemented, without departing from the broader scope of the invention as set forth in the claims that follow. The specification and drawings are accordingly to be regarded as an illustrative rather than restrictive sense.

We claim:

1. A method of testing an immersion cooling controller comprising:
    operably connecting a simulator device to an immersion cooling controller;
    using the simulator device to communicate one or more changes to the immersion cooling controller wherein the one or more changes relate to one or more sensed parameters of an immersion cooling system; and
    comparing a reaction of the controller to the one or more changes to an expected reaction of the controller to determine whether the controller is functioning properly;
    wherein the controller is configured to control one or more of temperature, water flow, pressure, fluid level, fluid purity, and any combination thereof in an immersion cooling system.

2. The method of claim 1 wherein the one or more sensed parameters comprise temperature, water flow, pressure, fluid level, fluid purity, and any combination thereof.

* * * * *